(12) United States Patent
Kuo

(10) Patent No.: US 8,168,533 B2
(45) Date of Patent: May 1, 2012

(54) THROUGH-SILICON VIA STRUCTURE AND METHOD FOR MAKING THE SAME

(75) Inventor: Chien-Li Kuo, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/215,246

(22) Filed: Aug. 23, 2011

(65) Prior Publication Data

US 2011/0300708 A1 Dec. 8, 2011

Related U.S. Application Data

(62) Division of application No. 12/399,987, filed on Mar. 9, 2009, now abandoned.

(51) Int. Cl.
*H01L 23/538* (2006.01)

(52) U.S. Cl. ......... 438/667; 257/774; 257/686; 257/621

(58) Field of Classification Search .................. 438/667
See application file for complete search history.

(56) References Cited

U.S. PATENT DOCUMENTS

| | | |
|---|---|---|
| 7,843,064 B2 | 11/2010 | Kuo |
| 2001/0049195 A1 | 12/2001 | Chooi |
| 2005/0167780 A1 | 8/2005 | Edelstein |
| 2005/0221601 A1 | 10/2005 | Kawano |
| 2008/0079131 A1 | 4/2008 | Kim |
| 2009/0065925 A1 | 3/2009 | Bernstein |
| 2010/0052063 A1 | 3/2010 | Masuoka |

*Primary Examiner* — N Drew Richards
*Assistant Examiner* — Peter Bradford
(74) *Attorney, Agent, or Firm* — Winston Hsu; Scott Margo

(57) ABSTRACT

A through-silicon via structure includes a substrate with a first side and a second side, a through-silicon hole connecting the first side and the second side and filled with a conductive material, a passivation layer disposed on and contacting the first side and covering the through-silicon hole, and a protection ring surrounding but not contacting the through-silicon hole and exposed by the first side and the second side. The protection ring is filled with an insulating material.

11 Claims, 4 Drawing Sheets

THROUGH-SILICON VIA STRUCTURE AND METHOD FOR MAKING THE SAME

CROSS REFERENCE TO RELATED APPLICATIONS

This application is a divisional application of and claims the benefit of U.S. patent application Ser. No. 12/399,987, filed Mar. 9, 2009.

BACKGROUND OF THE INVENTION

1. Field of the Invention

The present invention relates to a method for making a through-silicon via structure. In particular, the present invention relates to a method for making a through-silicon via structure with a protection ring.

2. Description of the Prior Art

The through-silicon via technique is a novel semiconductor technique. The through-silicon via technique mainly resides in solving the problem of the electrical interconnection of chips and belongs to a new 3D packing field. The hot through-silicon via technique creates the products which much more meet the market trends of "light, thin, short and small" by the 3D stacking through the through-silicon via to provide the micro electronic mechanic system (MENS), the photoelectronics and electronic elements with packing techniques of wafer-level package.

The through-silicon via technique drills holes in the wafer by etching or laser then fills the holes with conductive materials, such as copper, polysilicon or tungsten to form vias, i.e. conductive channels connecting inner regions and outer regions. Finally, the wafer or the dice is thinned to be stacked or bonded together to be a 3D stack IC. In such way, the wire bonding procedure may be omitted. Using etching or laser to form conductive vias not only omits the wire bonding but also shrinks the occupied area on the circuit board and the volume for packing. The inner connection distance of the package by the through-silicon via technique, i.e. the thickness of the thinned wafer or the dice, compared with the conventional stack package of wire bonding type, the 3D stack IC has much shorter inner connection distance, so the 3D stack IC performs better in many ways, such as faster transmission, and lower noise. Especially for the CPU, flash memory and memory card, the advantages of the shorter inner connection distance of the through-silicon via technique are much more outstanding. In addition, the package size of the 3D stack IC equals to the size of the dice, so the through-silicon via technique is more valuable in the portable electronic devices.

For the current process and techniques, the through-silicon via technique may divided into two types, namely the via first or the via last. The via first process further includes two variations, called before CMOS and after CMOS. In the via-first-before-CMOS process, through-silicon holes are formed on the silicon wafer and filled with a conductive material before the formation of the CMOS. Considering the high temperature procedures in the later CMOS process, the selection of the conductive material is basically focused on those which can bear high temperatures, such as poly silicon, rather than the better copper. To be viewed as a whole, the via-first-before-CMOS process is more compatible with the conventional CMOS process. However, the conductive material must bear high temperatures.

In the via-first-after-CMOS process, the formation of the via and the filling of the conductive metal are done after the completion of the CMOS process. The current conductive metal is copper, which is a better choice than poly silicon in conductivity concern. Because the filling of copper may fail due to the formation of void, tungsten may be an alternative choice. To be viewed as a whole, the filling of copper is particularly difficult because the CMOS is completed, which makes it less compatible with the conventional CMOS process.

Given the above, a novel method to make a novel through-silicon via structure is still needed. In this novel method, copper has the chance to replace the less conductive poly silicon in the through-silicon via structure. In addition, the completion of the CMOS will not hinder the planarization of the copper after the filling of copper.

SUMMARY OF THE INVENTION

Considering in the prior art that in the via-first-before-CMOS process less conductive material, such as poly silicon rather than copper, as the conductive material in the through-silicon hole is used because of better stability of high temperatures, or in the via-first-after-CMOS the filling of copper in the through-silicon hole is particularly difficult because the CMOS process is completed, the present invention proposes a novel method to make a novel through-silicon via structure. In this novel method, more conductive copper may replace the less conductive poly silicon in the through-silicon via structure. In addition, the completion of the CMOS will not hinder the planarization of the copper after the filling of copper.

The present invention first proposes a through-silicon via structure. The through-silicon via structure of the present invention includes a substrate with a first side and a second side opposite to the first side, a through-silicon hole connecting the first side and the second side and filled with a conductive material, a passivation layer disposed on and contacting the first side and covering the through-silicon hole, and a protection ring surrounding but not contacting the through-silicon hole, exposed by the first side and the second side and filled with an insulating material.

The present invention then proposes a method for forming a through-silicon via structure. First, a substrate with a first side and a second side opposite to the first side is provided. Second, an etching procedure is performed to form a through-silicon hole and a protection trench so that the protection trench surrounds the through-silicon hole. The through-silicon hole is deeper than the protection ring. Later, the protection trench and the through-silicon hole are filled with an insulating material. Then, a passivation layer is formed on the first side and covers the through-silicon hole. Afterwards, the substrate is thinned from the second side to expose the insulating material in the through-silicon hole. Thereafter, the insulating material in the through-silicon hole is replaced with a conductive material to form the through-silicon via structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
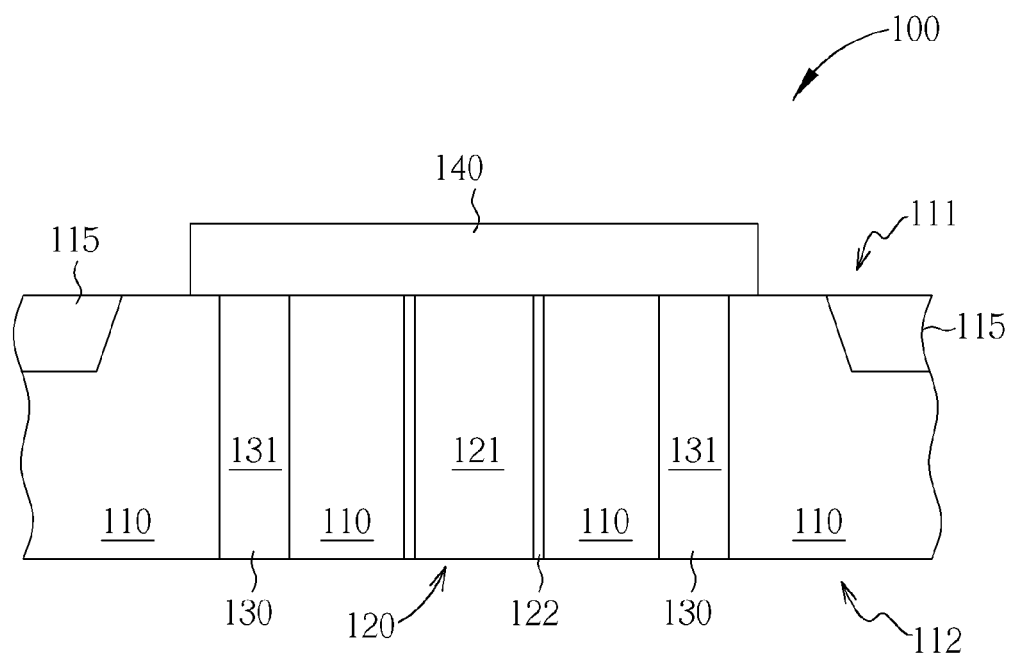
FIG. 1 illustrates a preferred example of the through-silicon via structure of the present invention.

The present invention first proposes a through-silicon via structure. FIG. 1 illustrates a preferred example of the through-silicon via structure of the present invention. The through-silicon via structure 100 of the present invention includes a substrate 110, a through-silicon hole 120, a passivation layer 130, and a protection ring 140. The substrate 110 may be a semiconductor material, such as Si. The substrate 110 has a first side 111 and a second side 112. Preferably, the first side 111 is opposite to the second side 112. The substrate 110 may further include a shallow trench isolation 115.

The through-silicon hole 120, as it literally means, is a hole through the silicon substrate and connects the first side 111 and the second side 112. The through-silicon hole 120 may be further filled with a first conductive material 121, such as poly silicon or a metal, preferably, copper, so that the first side 111 and the second side 112 are electrically connected. Optionally, the inner wall of the through-silicon hole 120 may further include a material layer 122. The material layer 122 may be a composite layer. For example, the material layer 122 may include a liner, an isolation layer, a barrier layer, a seed layer or the combination thereof.

The protection ring 130 completely surrounds the through-silicon hole 120 and is exposed by the first side 111 and the second side 112. The protection ring 130 is filled with an insulating material 131, such as silicon oxide, silicon nitride and silicon oxynitride. The protection ring 130 in one aspect protects the through-silicon hole 120, and in another aspect serves as the electrical isolation of the through-silicon hole 120. Preferably, the substrate 110 is sandwiched between the protection ring 130 and the through-silicon hole 120, so that the protection ring 130 does not directly contact the through-silicon hole 120.

Figure 2:
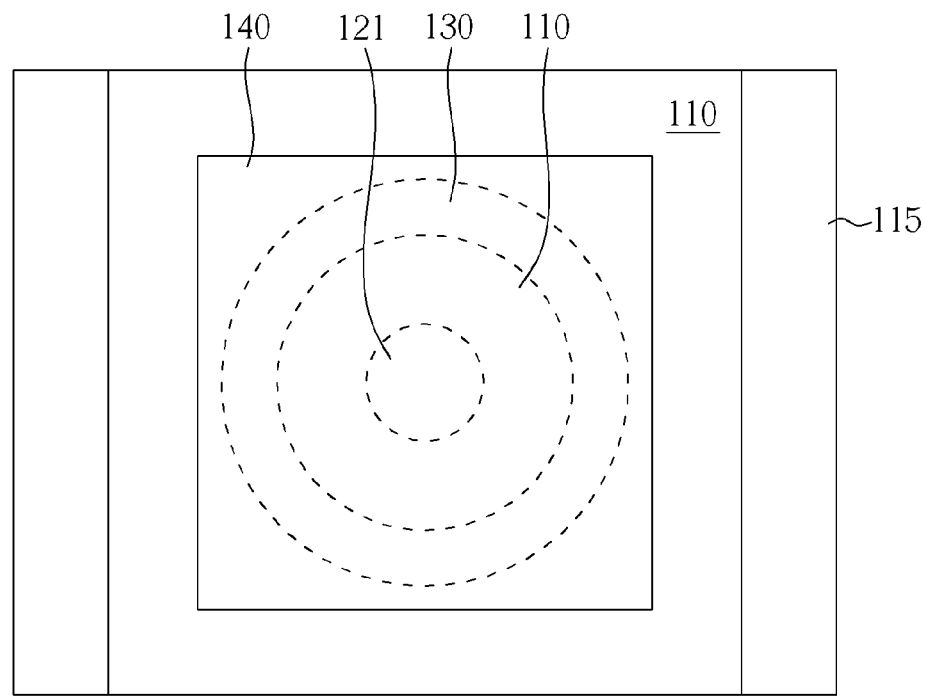
FIG. 2 illustrates a top view of the through-silicon via structure.
Figure 3:
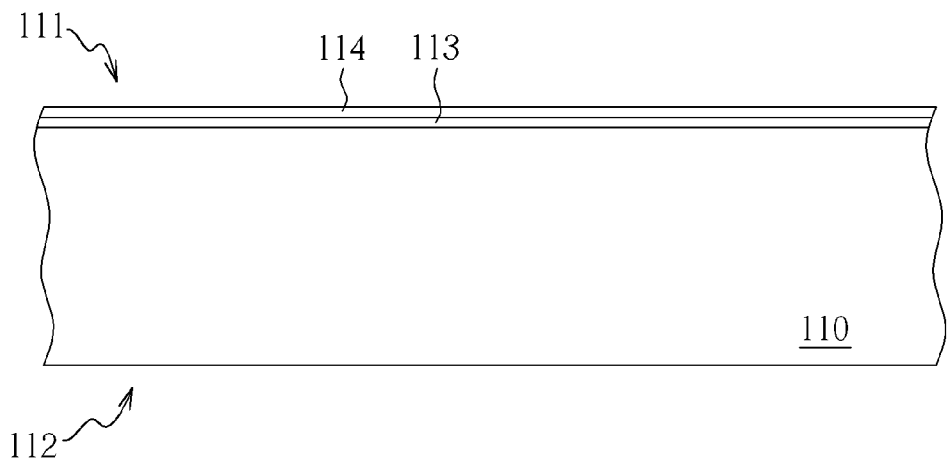
FIGS. 3-8 illustrate a preferred example of the method for the through-silicon via structure of the present invention.

The passivation layer 140 is disposed on either one of the first side 111 and the second side 112 and forms direct contact. The passivation layer 140 at least covers the through-silicon hole 120. Preferably, the passivation layer 140 covers the protection ring 130. The passivation layer 140 may include at least a gate structure, a metal interconnection and a contact etch stop layer (CESL). FIG. 2 illustrates a top view of the through-silicon via structure 100.

If the passivation layer 140 is for use in electrically connecting the through-silicon hole 120 and/or other chips, the passivation layer 140 may include a second conductive material, such as polysilicon or metal. In addition, the passivation layer 140 may also serve as the etch-stop layer of removing the insulating material (the isolation layer in the material layer 122 for example) in the through-silicon hole 120.

Preferably, the diameter X of the through-silicon hole 120 is larger than the width Y (ring width) of the protection ring 130. In addition, the conductive material 121 in the through-silicon hole 120 may bulge from the second side 112, so that the intrinsic depth of the through-silicon hole 120 is deeper than the depth of the protection ring 130. Optionally, the conductive material 121 bulging from the second side 112 may be processed to be covered by a solder ball (not shown). As a result, the conductive material 121 in the through-silicon hole 120 makes the 3D stack of dices possible, omits wire bonding procedure and saves more space.

The present invention second provides a method for forming a through-silicon via structure. FIGS. 3-8 illustrate a preferred example of the method for the through-silicon via structure of the present invention. Please refer to FIG. 3, first, a substrate 110 is provided. The substrate 110 may be a semiconductor material, such as Si. The substrate 110 has a first side 111 and a second side 112. Preferably, the first side 111 is opposite to the second side 112. Moreover, a pad oxide layer 113, a nitride layer 114 and/or a shallow trench isolation (not shown) may be formed on/in the substrate 110.

Figure 4:
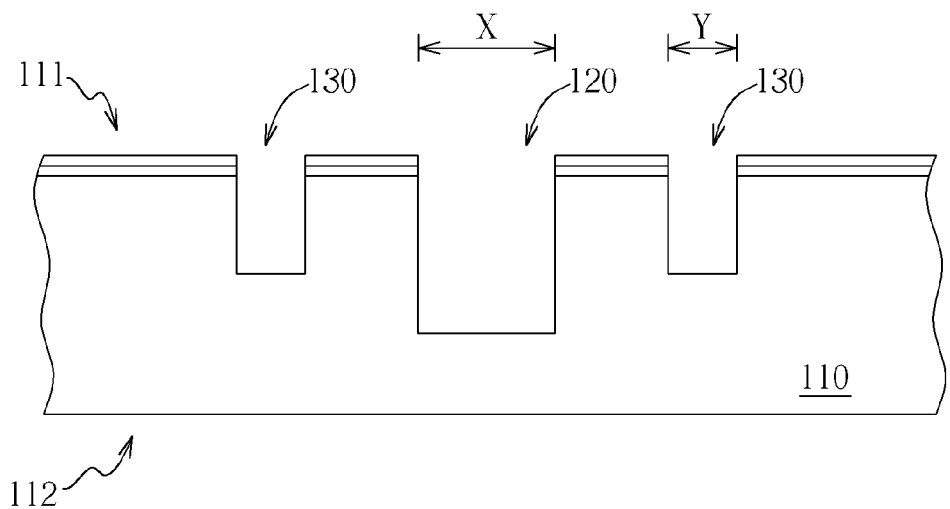

Second, please refer to FIG. 4, an etching procedure is performed to form a through-silicon hole 120 and a protection trench 130 in the substrate 110 so that the protection trench 130 surrounds the through-silicon hole 120. Preferably, the depth of the through-silicon hole 120 is deeper than the depth of the protection ring 130. For example, the through-silicon hole 120 and the protection ring 130 may have a suitable aspect ratio 8-15 to ensure the depth and width of the through-silicon hole 120 and the protection ring 130. The depth of the through-silicon hole 120 may be between 15~80 μm and the width between 2~10 μm and the depth of the protection ring 130 may be between 20~100 μm and the width between 5~20 μm.

The etching procedure may be regulated so that the depth of the through-silicon hole 120 is deeper than the depth of the protection ring 130. For example, in a dry etching method, the larger the open area of a trench is, the deeper the depth of the trench is. Accordingly, in one embodiment of the present invention, the pattern on the reticle in the lithographic step may be defined that the diameter of the through-silicon hole 120 is larger than the width (ring width) of the protection ring 130. Consequently, when the etching procedure is completed, the depth of the through-silicon hole 120 is deeper than the depth of the protection ring 130. Of course, the through-silicon hole 120 is not connected to the protection ring 130.

Optionally, a material layer 122 may be formed on the inner wall surface of the through-silicon hole 120. The material layer 122 may be a composite layer. For example, the material layer 122 may include a liner, an isolation layer or the combination thereof.

Figure 5:
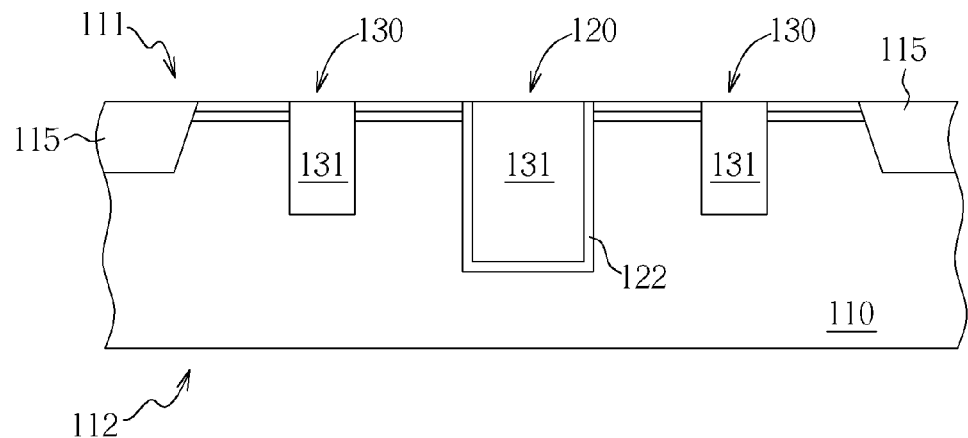

Later, please refer to FIG. 5, an insulating material 131, for example silicon oxide, silicon nitride or silicon oxynitride, is filled in the protection trench 130 and the through-silicon hole 120. For example, by deposition, the insulating material 131 may uniformly fill and cover the protection trench 130 and the through-silicon hole 120. Then a planarization procedure, such as chemical mechanical polishing, is performed to remove excess insulating material 131 till the nitride layer 114 is exposed.

Please note that, the shallow trench isolation 115 may be formed before, at the same time or after the protection trench 130 and the through-silicon hole 120 are formed. If the shallow trench isolation 115 is formed before the protection trench 130 and the through-silicon hole 120 are formed, the shallow trench isolation 115 may be constructed by conventional steps before the etching procedure illustrated in FIG. 4. If the shallow trench isolation 115 is formed after the protection trench 130 and the through-silicon hole 120 are formed, the shallow trench isolation 115 is constructed by conventional steps after the protection trench 130 and the through-silicon hole 120 are finished. If the shallow trench isolation 115 is formed when the protection trench 130 and the through-silicon hole 120 are formed, the shallow trench isolation 115 is defined along with the etching procedure illustrated in FIG. 4, so that the insulating material 131 is filled in the trench of the shallow trench isolation 115, too.

Figure 6:
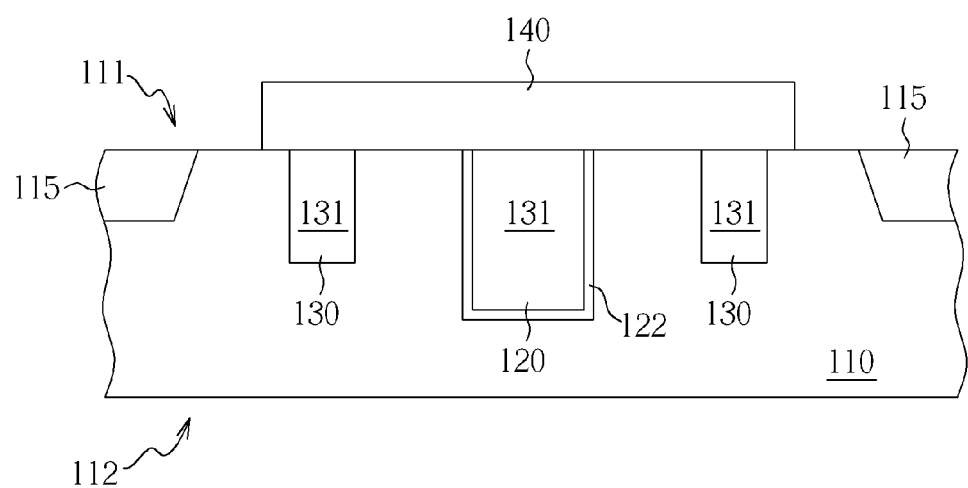

Then, as shown in FIG. 6, a passivation layer 140 is formed. The passivation layer 140 is disposed on the first side 111 and at least covers the through-silicon hole 120. Preferably, the passivation layer 140 also covers the protection trench 130. The passivation layer 140 may include at least a gate structure, a metal interconnection and a contact etch stop layer (CESL). The formation of the passivation layer 140 may go with other MOS processes, such as GOX or contact etch stop layer. Before the formation of the passivation layer 140, the pad oxide layer 113 and the nitride layer 114 may be removed.

If the passivation layer 140 is for use in electrically connecting the through-silicon hole 120 and/or other chips, the passivation layer 140 may include a conductive material, such as polysilicon or metal. In addition, the passivation layer 140 may also serve as the etch-stop layer of removing the insulating material (the isolation layer in the material layer 122 for example) in the through-silicon hole 120.

Because the protection trench 130 and the through-silicon hole 120 are filled with the insulating material 131 instead of copper, the insulating material 131 is not susceptible to the formation of the passivation layer 140, for example a high temperature condition. Accordingly, the passivation layer 140 can be constructed by any suitable semiconductor process.

Optionally, after the formation of the protection trench 130 and the through-silicon hole 120, a suitable semiconductor process such as a CMOS process may be performed first. The semiconductor process may be a gate process, a source/drain process and an interconnect process . . . etc. Then, the following procedures are carried out.

Figure 7:
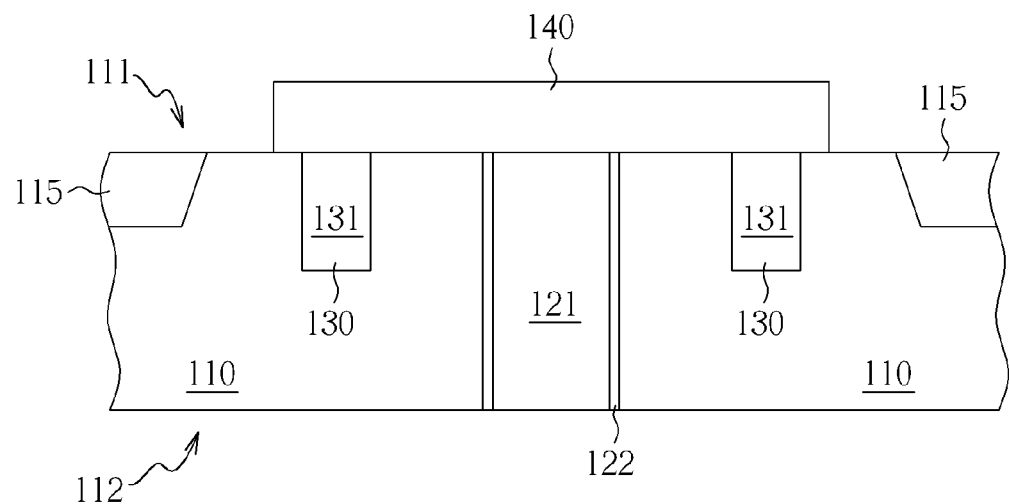

Afterwards, as shown in FIG. 7, the substrate 110 is thinned from the second side 112 to expose the insulating material 131 in the through-silicon hole 120. For example, a chemical mechanical polishing procedure (CMP) is performed on the second side 112 using the insulating material 131 as a stop layer to thin the substrate 110. Then, a conductive material 121 replaces the insulating material 131 in the through-silicon hole 120 to finish the through-silicon via.

For example, the insulating material 131 is removed by a proper etching method, then the conductive material 121, such as copper, is deposited to fill the through-silicon hole 120. Optionally, a chemical mechanical polishing procedure (CMP) may be performed to remove any excess conductive material 121. Because there is no obstacle on the second side 112 to hinder the deposition of the conductive material 121 and the chemical mechanical polishing procedure (CMP), the deposition of the conductive material 121 and the chemical mechanical polishing procedure (CMP) can be readily carried out. Before the deposition of the conductive material 121, a barrier layer and/or a seed layer may be formed in advance to be part of the material layer 122.

Figure 8:
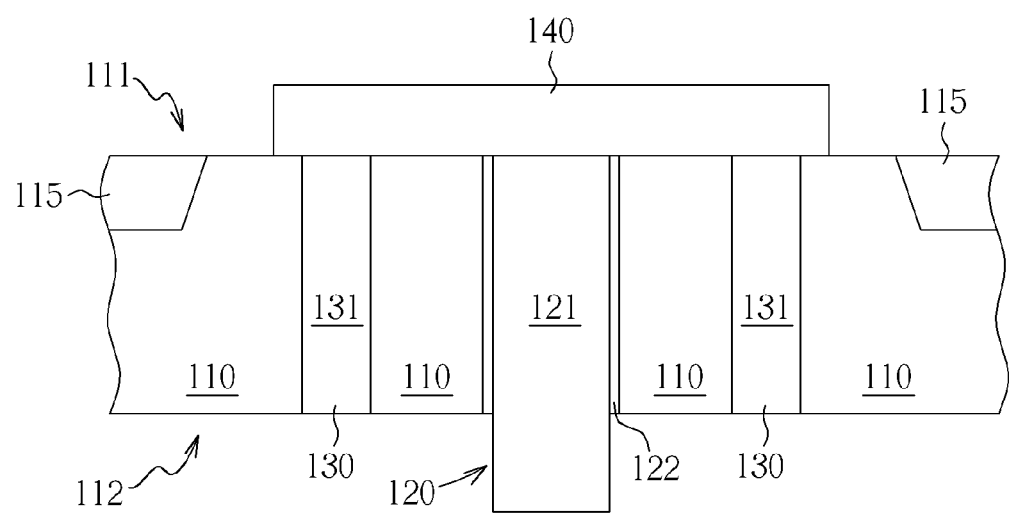

Thereafter, as shown in FIG. 8, the substrate 110 is again thinned from the second side 112 to expose the insulating material 131 in the protection trench 130 to form a protection ring 130. The passivation layer 140 may cover the protection ring 130. The protection ring 130 completely surrounds the through-silicon hole 120 and is exposed by the first side 111 and the second side 112.

The protection ring 130 is filled with an insulating material 131, such as silicon oxide, silicon nitride and silicon oxynitride. The protection ring 130 in one aspect protects the through-silicon hole 120, and in another aspect serves as the electrical isolation of the through-silicon hole 120. Preferably, the substrate 110 is sandwiched between the protection ring 130 and the through-silicon hole 120, so that the protection ring 130 does not directly contact the through-silicon hole 120. Because the depth of the through-silicon hole 120 is deeper than the depth of the protection ring 130, the conductive material 121 in the through-silicon hole 120 may bulge from the second side 112 to facilitate the following electrical connection. Optionally, the conductive material 121 bulging from the second side 112 may be again processed to be covered by a solder ball (not shown).

In the method of the present invention, in one aspect more conductive copper may replace the less conductive poly silicon in the through-silicon via structure to be more advantageous. In another aspect, the completion of the CMOS will not hinder the planarization of the copper after the filling of copper. This is a total solution to the formation of the through-silicon via.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a through-silicon via (TSV) structure, comprising:
    providing a substrate with a first side and a second side opposite to said first side;
    performing an etching procedure to form a through-silicon hole and a protection trench, so that said protection trench surrounds said through-silicon hole, wherein said through-silicon hole is deeper than said protection trench;
    filling said protection trench and said through-silicon hole with an insulating material;
    forming a passivation layer comprising a first conductive material and disposed on said first side and covering said through-silicon hole;
    thinning said substrate from said second side to expose said insulating material in said through-silicon hole; and
    replacing said insulating material in said through-silicon hole with a second conductive material to form said through-silicon via structure.

2. The method of claim 1, further comprising:
    continuing to thin said substrate from said second side to expose said insulating material in said protection trench to form a protection ring.

3. The method of claim 2, wherein said passivation layer covers said protection ring.

4. The method of claim 2, wherein said through-silicon hole does not contact said protection ring.

5. The method of claim 2, wherein said second conductive material bulges from said second side.

6. The method of claim 1, further comprising:
    forming a pad oxide layer on said substrate;
    forming a nitride layer on said pad oxide layer; and
    forming a shallow trench isolation in said substrate.

7. The method of claim 1, wherein the diameter of said through-silicon hole is larger than the trench width of said protection trench so that said etching procedure results in said through-silicon hole being deeper than said protection ring.

8. The method of claim 1, further comprising:
    forming at least one of a barrier layer and a liner in said through-silicon hole.

9. The method of claim 1, wherein said passivation layer is selected from a group consisting of a gate structure, a metal interconnection and a contact etch stop layer (CESL).

10. The method of claim 1, wherein thinning said substrate from said second side is carried out by a chemical mechanical polishing procedure.

11. The method of claim 1, between filling said protection trench and said through-silicon hole with said insulating material and thinning said substrate from said second side further comprising:
    performing a semiconductor process selected from a group consisting of a gate process for forming a gate, a source/drain process for forming a source/drain and an interconnect process for forming an interconnect.

* * * * *